United States Patent
Owings et al.

(10) Patent No.: US 11,319,628 B2
(45) Date of Patent: May 3, 2022

(54) ARTICLES WITH RESISTANCE GRADIENTS FOR UNIFORM SWITCHING

(71) Applicant: 3M INNOVATIVE PROPERTIES COMPANY, St. Paul, MN (US)

(72) Inventors: Robert R. Owings, Woodbury, MN (US); Mark J. Pellerite, Woodbury, MN (US); Arnold W. Funkenbusch, Mahtomedi, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 462 days.

(21) Appl. No.: 16/332,664

(22) PCT Filed: Sep. 18, 2017

(86) PCT No.: PCT/US2017/052059
§ 371 (c)(1),
(2) Date: Mar. 12, 2019

(87) PCT Pub. No.: WO2018/057458
PCT Pub. Date: Mar. 29, 2018

(65) Prior Publication Data
US 2021/0291956 A1 Sep. 23, 2021

Related U.S. Application Data

(60) Provisional application No. 62/398,953, filed on Sep. 23, 2016.

(51) Int. Cl.
*B64C 1/14* (2006.01)
*G02F 1/163* (2006.01)
*C23C 14/56* (2006.01)

(52) U.S. Cl.
CPC .......... *C23C 14/562* (2013.01); *B64C 1/1484* (2013.01); *B64C 1/1492* (2013.01); *G02F 1/163* (2013.01)

(58) Field of Classification Search
CPC ...... G02F 1/163; B64C 1/1492; B64C 1/1484
See application file for complete search history.

(56) References Cited

U.S. PATENT DOCUMENTS

| | | | |
|---|---|---|---|
| 7,317,566 B2 | 1/2008 | Tench | |
| 8,717,658 B2 | 5/2014 | Bergh | |
| 9,091,868 B2 | 7/2015 | Bergh | |
| 9,091,895 B2 | 7/2015 | Bergh | |
| 10,739,660 B2* | 8/2020 | Owings | G02F 1/155 |
| 2002/0135881 A1 | 9/2002 | Rukavina | |
| 2004/0061919 A1 | 4/2004 | Tench | |
| 2007/0002421 A1 | 1/2007 | Rukavina | |
| 2010/0208324 A1 | 8/2010 | Huang | |
| 2011/0317243 A1 | 12/2011 | Piroux | |
| 2012/0147448 A1 | 6/2012 | Yaniv | |
| 2012/0200908 A1 | 8/2012 | Bergh | |
| 2016/0299400 A1* | 10/2016 | Miyazaki | G02F 1/155 |

OTHER PUBLICATIONS

International Search Report for PCT International Application No. PCT/US2017/052059, dated Jan. 4, 2018, 4 pages.

* cited by examiner

*Primary Examiner* — Cara E Rakowski

(57) ABSTRACT

An article is provided. The article includes a first transparent conductive oxide layer, a transparent metal layer on the first transparent conductive oxide layer, wherein a thickness of the transparent metal layer continuously decreases in a direction; and a second transparent conductive oxide layer on the transparent metal layer.

20 Claims, 1 Drawing Sheet

ARTICLES WITH RESISTANCE GRADIENTS FOR UNIFORM SWITCHING

BACKGROUND

Smart windows are designed to reduce the amount of energy consumed for climate control of buildings and transportation vehicles by controlling the amount of solar radiation that is transmitted into such buildings and vehicles, which produces interior heating via the greenhouse effect. Currently, smart window products are usually fabricated by apply the coatings to glass.

The switching speed of current smart windows is limited by the resistance of the transparent conductive films. As the size of smart windows is increased, the switching speed of smart windows decreases proportionally. If the voltage applied to smart windows is increased to speed switching, non-uniform switching would happen, where the outer areas of the windows switch more quickly. This problem, commonly referred to as the "iris effect," is typically the result of the voltage drop along the transparent conductors from the outer to inner window areas.

SUMMARY

The current application provides an article with transparent conductive coatings, which maintains a good optical transmission and neutral color while possessing in plane electrical resistance variation, thereby reducing or eliminating the iris effect.

Thus, in one aspect, the present disclosure provides an article comprising: a first transparent conductive oxide layer, a transparent metal layer on the first transparent conductive oxide layer, wherein a thickness of the transparent metal layer continuously decreases in a direction; and a second transparent conductive oxide layer on the transparent metal layer; wherein a sheet resistance, $R_s$, to the flow of electrical current through the article, varies as a function of position in the article; and wherein a ratio of the value of maximum sheet resistance, $R_{max}$, to the value of minimum sheet resistance, $R_{min}$, in the article is at least 1.5.

In another aspect, the present disclosure provides a device comprising: a first transparent substrate; a first transparent conductive oxide layer, a first transparent metal layer on the first transparent conductive oxide layer, wherein the thickness of the first transparent metal layer continuously decreases in a first direction; and a second transparent conductive oxide layer on the transparent metal layer.

In another aspect, the present disclosure provides an article comprising: a first transparent conductive oxide layer, wherein the first transparent conductive oxide layer has a first bulk resistivity; a transparent metal layer on the first transparent conductive oxide layer, wherein a thickness of the transparent metal layer continuously decreases in a direction; and a second transparent conductive oxide layer on the transparent metal layer, wherein the second transparent conductive oxide layer has a second bulk resistivity; wherein the first bulk resistivity is higher than the second bulk resistivity; wherein a sheet resistance, $R_s$ of the article, varies as a function of position in the article; and wherein the ratio of the value of maximum sheet resistance, $R_{max}$, to the value of minimum sheet resistance, $R_{min}$, in the article is at least 1.5.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The Drawings and the Detailed Description that follow more particularly exemplify certain embodiments using the principles disclosed herein.

Definitions

For the following defined terms, these definitions shall be applied for the entire Specification, including the claims, unless a different definition is provided in the claims or elsewhere in the Specification based upon a specific reference to a modification of a term used in the following definitions:

The terms "about" or "approximately" with reference to a numerical value or a shape means+/−five percent of the numerical value or property or characteristic, but also expressly includes any narrow range within the +/−five percent of the numerical value or property or characteristic as well as the exact numerical value. For example, a temperature of "about" 100° C. refers to a temperature from 95° C. to 105° C., but also expressly includes any narrower range of temperature or even a single temperature within that range, including, for example, a temperature of exactly 100° C. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

The terms "conductive" and "resistive" refer to the electrical conductivity and electrical resistivity of a material.

The term "transparent" is used to denote substantial transmission of electromagnetic radiation through a material such that, for example, bodies situated beyond or behind the material can be distinctly seen or imaged using appropriate image sensing technology The terms "a", "an", and "the" include plural referents unless the content clearly dictates otherwise. Thus, for example, reference to a material containing "a compound" includes a mixture of two or more compounds.

BRIEF DESCRIPTION OF THE DRAWINGS

The disclosure may be more completely understood in consideration of the following detailed description of various embodiments of the disclosure in connection with the accompanying figures, in which.

While the above-identified drawings, which may not be drawn to scale, set forth various embodiments of the present disclosure, other embodiments are also contemplated, as noted in the Detailed Description. In all cases, this disclosure describes the presently disclosed invention by way of representation of exemplary embodiments and not by express limitations. It should be understood that numerous other modifications and embodiments can be devised by those skilled in the art, which fall within the scope and spirit of this disclosure.

DETAILED DESCRIPTION

Before any embodiments of the present disclosure are explained in detail, it is understood that the invention is not limited in its application to the details of use, construction, and the arrangement of components set forth in the following description. The invention is capable of other embodiments and of being practiced or of being carried out in various ways that will become apparent to a person of ordinary skill in the art upon reading the present disclosure. Also, it is understood that the phraseology and terminology used herein is for the purpose of description and should not be regarded as limiting. The use of "including," "comprising," or "having" and variations thereof herein is meant to encompass the items listed thereafter and equivalents thereof as well as additional items. It is understood that other embodiments may be utilized and structural or logical changes may be made without departing from the scope of the present disclosure.

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Figure 1:
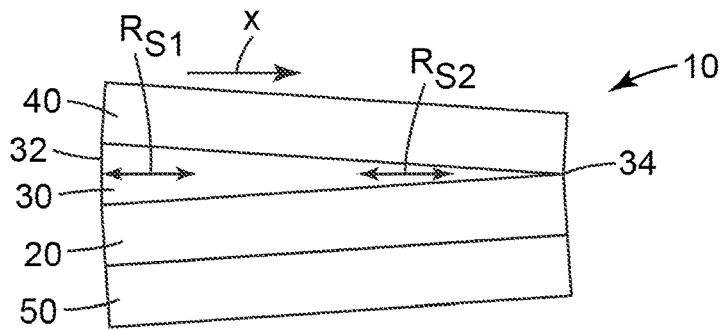
FIG. 1 is a schematic cross-section of an article according to one embodiment of the present application.

FIG. 1 depicts a cross-sectional structural diagram of an article 10 according to one embodiment of the present application. Article 10 includes a first transparent conductive oxide layer 20. A transparent metal layer 30 is on one side of and in contact with a surface of first transparent conductive oxide layer 20. A second transparent conductive oxide layer 40 is on and in contact with the transparent metal layer 30. The thickness of the transparent metal layer may be graded in a direction. The thickness of the transparent metal layer may or may not be linear graded along the first direction. In some embodiments, the thickness of the transparent metal layer may increase or decrease exponentially or linearly. In some embodiments, the thickness of the transparent metal layer may continuously decreases in x direction as illustrated in FIG. 1. In other embodiments, the thickness of the transparent metal layer may continuously decrease in a direction other than x direction. Article 10 may further include a substrate 50 and first transparent conductive oxide layer 20 is positioned between transparent metal layer 30 and substrate 50.

Transparent conductive oxide layers 20 and 40 may include any oxide material exhibiting sufficient conductivity, optical transparency and chemical stability for the intended application. Transparent conductive oxides may include metal oxides and doped metallic oxide. Examples of such metal oxides and doped metallic oxide, include but are not limited to, indium oxide, indium tin oxide (ITO), tin oxide, zinc oxide, zinc aluminum oxide, zinc tin oxide, doped tin oxide, doped zinc oxide, fluorine-doped tin oxide (FTO), aluminum-doped zinc oxide, antimony-doped tin oxide, fluorine-doped indium oxide, aluminum-doped tin oxide, phosphorus-doped tin oxide, indium zinc oxide, indium gallium zinc oxide and the like. Conductive oxide layers 20 and 40 are transparent in order to enable use of article 10 as a transparent conductor in an electrochromic device.

Figure 2:
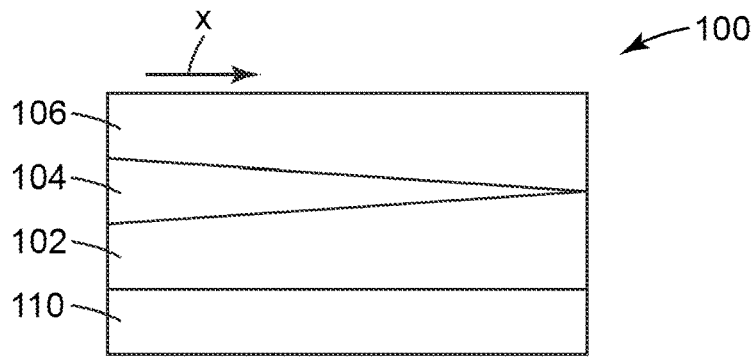
FIG. 2 is a schematic cross-section of an article according to one embodiment of the present application.

The thickness of transparent conductive oxide layers may be influenced by the composition of the material formed within the layer and its transparent and chemical character. In some embodiments, the thickness of transparent conductive oxide layers may be substantially uniform as illustrated in FIG. 1. In other embodiments, the thickness of transparent conductive oxide layers may be non-uniform. In some other embodiments, the thickness of transparent conductive oxide layers 102 and 104 may be non-uniform as illustrated in FIG. 2. In some embodiments, transparent conductive oxide layers may have a thickness that is between 10 nm and 1000 nm. In some embodiments, transparent conductive oxide layers may have a thickness that is between 20 nm and 200 nm. Thicker or thinner transparent conductive oxide layers may be employed so long as they provide the necessary electrical properties (e.g., conductivity) and optical properties (e.g., transmittance).

The first transparent conductive oxide layer 20 has a first bulk resistivity and the second transparent conductive oxide layer 40 has a second bulk resistivity. In some embodiments, the first bulk resistivity may be higher than the second bulk resistivity. When the first bulk resistivity is higher than the second bulk resistivity, the first transparent conductive oxide layer 20 has a higher sheet resistance at the equal thickness than the second transparent conductive oxide layer 40. In other words, Rs of the first transparent conductive oxide layer 20 is higher than Rs of the second transparent conductive oxide layer 40, where the first transparent conductive oxide layer 20 has a same thickness as the second transparent conductive oxide layer 40. In some embodiments, the first bulk resistivity may be at least 600 $\mu\Omega\cdot cm$, 650 $\mu\Omega\cdot cm$, 700 $\mu\Omega\cdot cm$, or 750 $\mu\Omega\cdot cm$. In some embodiments, the first bulk resistivity may be from 600 to 800 $\mu\Omega\cdot cm$, from 650 to 800 $\mu\Omega\cdot cm$, from 700 to 800 $\mu\Omega\cdot cm$ or from 750 to 800 $\mu\Omega\cdot cm$. In some embodiments, the second bulk resistivity may be no more than 400 $\mu\Omega\cdot cm$, 350 $\mu\Omega\sim cm$, 300 $\mu\Omega\cdot cm$, 250 $\mu\Omega\cdot cm$, 200 $\mu\Omega\cdot cm$, 150 $\mu\Omega\cdot cm$, 100 $\mu\Omega\cdot cm$, or 75 $\mu\Omega\cdot cm$. In some embodiments, the second bulk resistivity may be from 50 to 400 $\mu\Omega\cdot cm$, from 75 to 400 $\mu\Omega\cdot cm$, or from 100 to 400 $\mu\Omega\cdot cm$, from 200 to 400 $\mu\Omega\cdot cm$, or from 300 to 400 $\mu\Omega\cdot cm$. In some embodiments, the second bulk resistivity may be higher than the first bulk resistivity.

Transparent metal layer 30 may include any metal exhibiting necessary resistivity, optical transparency and chemical stability, for the intended application. Examples of such metal, include but are not limited to, silver, silver alloy and the like. Examples of silver alloy include but are not limited to, gold-silver alloy, platinum-silver alloy, palladium-silver alloy and the like. The thickness of the transparent metal layer may be graded to decrease from one edge of the transparent metal layer to the other edge opposite. The electrical resistance of transparent metal layer 30 is related to the thickness of transparent metal layer 30. Therefore, transparent metal layer 30 may have a sheet resistance, $R_s$, to the flow of electrical current through the article 10 that varies as a function of position in the article 10. In the embodiment of FIG. 1, the sheet resistance, $R_s$, within the transparent metal layer progressively increases along x direction and between first edge 32 and second edge 34 of the transparent metal layer. For example, the transparent metal layer 30 has a higher sheet resistance $Rs_2$ near the second edge 34, where the transparent metal layer has a less thickness and a lower sheet resistance $Rs_1$ near the first edge 32, where the transparent metal layer has a more thickness.

The electrical resistance of transparent metal layer 30 is related to the thickness of transparent metal layer 30. In some embodiment, the non-uniform sheet resistance of transparent metal layer 30 is the result of a thickness variation in the transparent metal layer 30. Thickness variations may be formed by vacuum deposition techniques, for example, by sputter coating as a substrate moves past the sputter cathode or evaporation source to control layer thicknesses as required. In other embodiments, thickness variations may be formed by sputter coating from a target at constant power and varying the velocity of substrate under the target as a function of position relative to the substrate. Shields can be also used to block material transport to the substrate to vary the deposited thicknesses across a substrate. Multiple sputter sources or evaporation sources can be used across the substrate as it passes with power to each source controlled to create the required thickness. A sputter source with intentional cross substrate variation of deposition due to power, magnetic field, or gas flow may be also used to create the required thickness variations.

In one exemplary embodiment, the ratio of the value of maximum sheet resistance, $R_{max}$, to the value of minimum sheet resistance, $R_{min}$, in transparent metal layer is at least about 1.5. In one exemplary embodiment, the ratio of the value of maximum sheet resistance, $R_{max}$, to the value of minimum sheet resistance, $R_{min}$, in transparent metal layer is at least about 2. In one exemplary embodiment, the ratio of the value of maximum sheet resistance, $R_{max}$, to the value of minimum sheet resistance, $R_{min}$, in transparent metal layer is at least about 3. In one exemplary embodiment, the ratio of the value of maximum sheet resistance, $R_{max}$, to the value of minimum sheet resistance, $R_{min}$, in transparent metal layer is at least about 4. In one exemplary embodiment, the ratio of the value of maximum sheet resistance, $R_{max}$, to the value of minimum sheet resistance, $R_{min}$, in transparent metal layer is at least about 5. In one exemplary embodiment, the ratio of the value of maximum sheet resistance, $R_{max}$, to the value of minimum sheet resistance, $R_{min}$, in transparent metal layer is at least about 10.

The substrate 50 may be transparent, in order to enable use of article 10 as a transparent conductor in an electrochromic device. Any material having suitable optical, electrical, thermal, and mechanical properties may be used as substrate 50. Such substrates include, for example, glass, polymer, metal, and metal coated glass or plastic. The substrate 50 may comprise any suitable polymer, polycarbonate, for example. Non-exclusive examples of possible polymer substrates are polycarbonates, polyacrylics, polyurethanes, urethane carbonate copolymers, polysulfones, polyimides, polyacrylates, polyethers, polyester, polyethylenes, polyalkenes, polyimides, polysulfides, polyvinylacetates and cellulose-based polymers. The substrate 50 may comprise any suitable glass, soda lime glass, for example. Suitable glasses include either clear or tinted soda lime glass, including soda lime float glass. The glass may be tempered or untempered.

A sheet resistance, $R_s$, to the flow of electrical current through the article, may also vary as a function of position in the article. In one exemplary embodiment, the ratio of the value of maximum sheet resistance, $R_{max}$, to the value of minimum sheet resistance, $R_{min}$, in the article is at least about 1.5. In one exemplary embodiment, the ratio of the value of maximum sheet resistance, $R_{max}$, to the value of minimum sheet resistance, $R_{min}$, in the article is at least about 2. In one exemplary embodiment, the ratio of the value of maximum sheet resistance, $R_{max}$, to the value of minimum sheet resistance, $R_{min}$, in the article is at least about 3. In one exemplary embodiment, the ratio of the value of maximum sheet resistance, $R_{max}$, to the value of minimum sheet resistance, $R_{min}$, in the article is at least about 4. In one exemplary embodiment, the ratio of the value of maximum sheet resistance, $R_{max}$, to the value of minimum sheet resistance, $R_{min}$, in the article is at least about 5. In one exemplary embodiment, the ratio of the value of maximum sheet resistance, $R_{max}$, to the value of minimum sheet resistance, $R_{min}$, in the article is at least about 10.

The article 10 may be transmissive to electromagnetic radiation having a wavelength in the range of infrared to ultraviolet. For example, in one embodiment, the article 10 is transparent to electromagnetic radiation having a wavelength from 300 to 5000 nm. In one exemplary embodiment, the visible light transmission of the article may be more than 40%. In one exemplary embodiment, the visible light transmission of the article may be more than 50%. In one exemplary embodiment, the visible light transmission of the article may be more than 60%. In one exemplary embodiment, the visible light transmission of the article may be more than 70%.

The article 10 has a range of electrical resistance by varying the silver thickness, while maintaining good optical transmission. In some embodiments, the visible light transmission of the article varies less than 20% in a direction, for example, x direction or a direction perpendicular to x direction. In some embodiments, the visible light transmission of the article varies less than 15% in a direction. In some embodiments, the visible light transmission of the article varies less than 10% in a direction. In some embodiments, the visible light transmission of the article varies less than 5% in a direction. In other embodiments, the reflectance of the article varies less than 10% in a direction, for example, x direction or a direction perpendicular to x direction.

Figure 3:
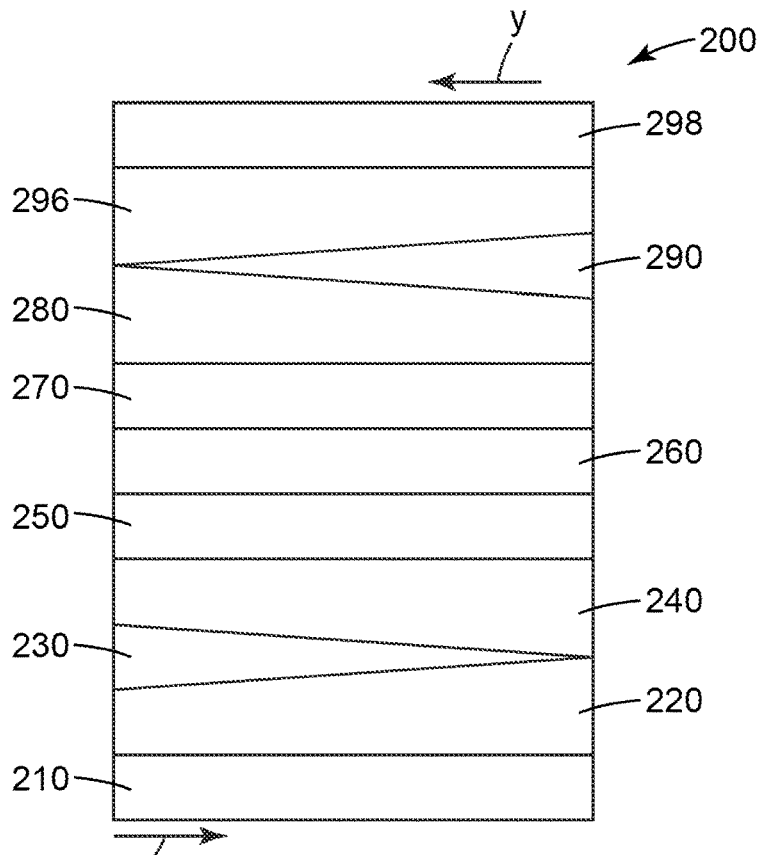
FIG. 3 is a schematic cross-section of an device according to one embodiment of the present application.

FIG. 3 depicts a cross-sectional structural diagram of a device 200 according to one embodiment of the present application. Device 200 includes a first transparent substrate 210 and a first transparent conductive oxide layer 220. A first transparent metal layer 230 is on one side of and in contact with a surface of first transparent conductive oxide layer 220. A second transparent conductive oxide layer 240 is on and in contact with the first transparent metal layer 230. Device 200 may further include a third transparent conductive oxide layer 280, the second transparent conductive oxide layer 240 being located between the first transparent metal layer 230 and the third transparent conductive oxide layer 280. A second transparent metal layer 290 is on the third transparent conductive oxide layer 280. A fourth transparent conductive oxide layer 296 is on the second transparent metal layer 290 and a second substrate 298 is on the fourth transparent conductive oxide layer 296. Device 200 also includes a first electrode layer 250 on a surface of the second transparent conductive oxide layer 240, the second transparent conductive oxide layer 240 being between the first electrode layer 250 and first transparent metal layer 230. The thickness of the transparent metal layers 230 and 290 may be graded in a direction. In some embodiments, the thickness of the transparent metal layer 230 continuously decreases in x direction as illustrated in FIG. 3 and the thickness of the transparent metal layer 290 continuously decreases in y direction, which is opposite to the x direction. Device 200 may further include an ion conducting layer 260 and a second electrode layer 270, ion conducting layer 260 being between the first electrode layer 250 and second electrode layer 270.

In one embodiment, first electrode layer 250 may contains any one or more of a number of different electrochromic materials. Second electrode layer 270 serves as the counter electrode to first electrode layer 250 and, like first electrode layer 250, second electrode layer 270 may comprise electrochromic materials as well as non-electrochromic materials. Non-exclusive examples of second electrode layer 270 may include those disclosed in U.S. Pat. No. 8,717,658, for example, cathodically coloring electrochromic thin films of oxides based on tungsten, molybdenum, niobium, titanium, lead and/or bismuth, anodically coloring electrochromic thin films of oxides, hydroxides and/or oxy-hydrides based on nickel, iridium, iron, chromium, cobalt and/or rhodium, or non-electrochromic thin films, e.g., of oxides based on vanadium and/or cerium as well as activated carbon, or combinations thereof.

The thickness of the first electrode layer 250 and second electrode layer 270 may depend on the electrochromic material selected for the electrochromic layer. In some embodiments, first electrode layer 250 and second electrode layer 270 are from 50 nm to 2,000 nm, or from 100 nm to 700 nm.

Ion conducting layer 260 may include an ion conductor material and ion conducting layer 260 may be highly conductive to the relevant ions for the first and second electrode layers 250 and 270. Such ions may include those disclosed in U.S. Pat. No. 8,717,658, for example, lithium ions ($Li^+$) and hydrogen ions ($H^+$) (i.e., protons), deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). The thickness of the ion conducting layer 260 may depend on the ion conductor material used. In some embodiments using an inorganic ion conductor, the thickness of the ion conducting layer 260 may be from 1 nm to 250 nm to thick. In other embodiments using an organic ion conductor, the thickness of the ion conducting layer 260 may be from 1000 nm to 100000 nm. The thickness of the ion conducting layer may be substantially uniform.

The device 200 may be transmissive to electromagnetic radiation having a wavelength in the range of infrared to ultraviolet. For example, in one embodiment the device 200 is transparent to electromagnetic radiation having a wavelength from 300 to 5000 nm. In one exemplary embodiment, the visible light transmission of the device may be more than 40%. In one exemplary embodiment, the visible light transmission of the device may be more than 50%. In one exemplary embodiment, the visible light transmission of the device may be more than 60%. In one exemplary embodiment, the visible light transmission of the device may be more than 70%.

The device 200 displays reduced or eliminated iris effect, while maintaining good optical transmission. In some embodiments, the visible light transmission of the device varies less than 20% in a direction, for example, x direction or a direction perpendicular to x direction. In some embodiments, the visible light transmission of the device varies less than 15% in a direction. In some embodiments, the visible light transmission of the device varies less than 10% in a direction. In some embodiments, the visible light transmission of the device varies less than 5% in a direction. In other embodiments, the reflectance of the device varies less than 10% in a direction, for example, x direction or a direction perpendicular to x direction.

The following embodiments are intended to be illustrative of the present disclosure and not limiting.

EMBODIMENTS

1. An article comprising:
a first transparent conductive oxide layer,
a transparent metal layer on the first transparent conductive oxide layer, wherein a thickness of the transparent metal layer continuously decreases in a direction; and
a second transparent conductive oxide layer on the transparent metal layer;
wherein a sheet resistance, $R_s$, to the flow of electrical current through the article, varies as a function of position in the article; and
wherein a ratio of the value of maximum sheet resistance, $R_{max}$, to the value of minimum sheet resistance, $R_{min}$, in the article is at least 1.5.

2. The article of embodiment 1, wherein the ratio of the value of maximum sheet resistance, $R_{max}$, to the value of minimum sheet resistance, $R_{min}$, in the transparent conducting layer is at least 5.

3. The article of any one of embodiments 1 to 2, wherein the article is transparent to electromagnetic radiation having a wavelength from 300 to 5000 nm.

4. The article of any one of embodiments 1 to 3, wherein the visible light transmission of the article is more than 40%.

5. The article of any one of embodiments 1 to 4, wherein the visible light transmission of the article varies less than 10% in the direction or a direction perpendicular to the direction.

6. The article of any one of embodiments 1 to 5, wherein the visible light transmission of the article varies less than 5% in the direction or a direction perpendicular to the direction.

7. The article of any one of embodiments 1 to 6, wherein the reflectance of the article varies less than 4% in the direction or a direction perpendicular to the direction.

8. The article of any one of embodiments 1 to 7, further comprising a substrate.

9. The article of any one of embodiments 1 to 8, wherein the transparent metal layer comprises silver or silver alloy.

10. The article of any one of embodiments 1 to 9, wherein the first and second transparent conductive oxide layers comprise indium tin oxide, tin oxide, zinc oxide, zinc aluminum oxide, zinc tin oxide, indium gallium zinc oxide, or combinations thereof.

11. The article of any one of embodiments 1 to 10, wherein the transparent conductive coating is indium tin oxide.

12. The article of embodiment 8, wherein the substrate is a glass substrate or a polymer substrate.

13. A device comprising:
a first transparent substrate;
a first transparent conductive oxide layer;
a first transparent metal layer on the first transparent conductive oxide layer, wherein the thickness of the first transparent metal layer continuously decreases in a first direction; and
a second transparent conductive oxide layer on the transparent metal layer.

14. The device of embodiment 13, further comprising
a third transparent conductive oxide layer, the second transparent conductive oxide layer being located between the first transparent metal layer and the third transparent conductive oxide layer;
a second transparent metal layer on the third transparent conductive oxide layer, wherein the thickness of the second transparent metal layer is graded in a direction opposite to the first direction; and
a fourth transparent conductive oxide layer on the second transparent metal layer.

15. The device of embodiment 14, the visible light transmission of the device varies less than 10% in the direction or a direction perpendicular to the direction.

16. The device of embodiments 13 to 15, wherein the visible light transmission of the device varies less than 5% in the direction or a direction perpendicular to the direction.

17. The device of embodiments 13 to 16, wherein the reflectance of the device varies less than 4% in the direction or a direction perpendicular to the direction.

18. The device of embodiments 14 to 17, wherein the first and second transparent metal layer comprises silver or silver alloy.

19. The device of embodiments 14 to 18, wherein the first, second, third and fourth transparent conductive oxide layers comprise indium tin oxide, tin oxide, zinc oxide, zinc aluminum oxide, zinc tin oxide, or combinations thereof.

20. The device of embodiments 13 to 19, wherein the visible light transmission of the article is more than 40%.

21. An article comprising:
a first transparent conductive oxide layer, wherein the first transparent conductive oxide layer has a first bulk resistivity;
a transparent metal layer on the first transparent conductive oxide layer, wherein a thickness of the transparent metal layer continuously decreases in a direction; and
a second transparent conductive oxide layer on the transparent metal layer, wherein the second transparent conductive oxide layer has a second bulk resistivity;
wherein the first bulk resistivity is higher than the second bulk resistivity;
wherein a sheet resistance, $R_s$ of the article, varies as a function of position in the article; and
wherein the ratio of the value of maximum sheet resistance, $R_{max}$, to the value of minimum sheet resistance, $R_{min}$, in the article is at least 1.5.

22. The article of claim 21, wherein the first bulk resistivity is from 600 to 800 μΩ·cm.

23. The article of any one of claims 21 to 22, wherein the second bulk resistivity is from 50 to 400 μΩ·cm.

24. The article of any one of claims 21 to 23, wherein the visible light transmission of the article varies less than 10% in the first direction or a direction perpendicular to the first direction.

25. The article of any one of claims 21 to 24, wherein the visible light transmission of the article varies less than 5% in the first direction or a direction perpendicular to the first direction.

26. An article comprising:
a first transparent conductive oxide layer, wherein the first transparent conductive oxide layer has a first bulk resistivity,
a transparent metal layer on the first transparent conductive oxide layer, wherein a sheet resistance of the transparent metal layer is graded in a direction; and
a second transparent conductive oxide layer on the transparent metal layer, wherein the second transparent conductive oxide layer has a second bulk resistivity;
wherein the first bulk resistivity is higher than the second bulk resistivity;
wherein a sheet resistance, R of the article, varies as a function of position in the article; and
wherein the ratio of the value of maximum sheet resistance, $R_{max}$, to the value of minimum sheet resistance, $R_{min}$, in the article is at least 1.5.

The following working examples are intended to be illustrative of the present disclosure and not limiting.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. Solvents and other reagents used may be obtained from Sigma-Aldrich Chemical Company (St. Louis, Mo.) unless otherwise noted. In addition, Table 1 provides abbreviations and a source for all materials used in the Examples below:

TABLE 1

Materials.

| Abbreviation or Tradename | Description | Source |
| --- | --- | --- |
| ST505 | Heat stabilized 5 mil polyethylene terephthalate (PET) | Dupont Teijin Films (Chester, VA) |
| Ag | Silver sputtering target | DHF Technical Products (Rio Rancho, NM) |
| AgAu | Silver/gold sputtering target (85/15 wt %) | DHF Technical Products (Rio Rancho, NM) |
| ITO | Tin-doped indium oxide sputtering target | Umicore Thin Film Products (Providence, RI) |
| LiTFSI | lithium bis(trifluoromethylsulfonimide) | 3M Company (St. Paul, MN) |
| | Propylene carbonate (anhydrous) | Sigma-Aldrich Chemical Company (St. Louis, MO) |
| | Dimethyl carbonate | Sigma-Aldrich Chemical Company (St. Louis, MO) |

Methods

Measurement of Visible Light Transmittance

The visible light transmitted was measured using an UltraScan PRO by HunterLab (Reston, Va.) and is reported as a percentage.

Measurement of Electrical Resistance

The electrical resistance of film samples was measured using an eddy current sheet resistance measurement instrument from Delcom Instruments, Inc. (Minneapolis, Minn.). A Delcom model 727 was used in-line and a Delcom model 717 was used off-line. The instruments were used in low conductivity mode.

Example 1

ITO/Ag/ITO trilayers were coated on a PET film substrate by sputtering. A layer of ITO was deposited at 3-4 feet per minute in 325 sccm Ar and 3.5 sccm $O_2$ at a watt density of 6.039 W/cm$^2$ in one pass. The web was then reversed and the Ag layer deposited at 2 kW in a pressure of 3 mTorr argon at 5.5-6.5 fpm with a shadow mask between the target and the web. The web was again reversed and ITO deposited similar to the first layer. Silver thickness was varied by use of the mask, which had a triangular cutout to create a thickness variation across the PET film, with the silver thickness ranging from 4 to 20 nm. ITO layers were of a uniform thickness sufficient to provide optical tuning for maximum transmission. Samples were cut from the resultant sputter-coated PET film and light transmission and resistivity were measured across the width (cross web). Data was taken for a short section across the polymer web, and each measurement was labeled with its cross web position, as reported in Table 2. The data shows that a large gradient in resistivity was achieved while maintaining visible light transmission greater than 60%.

TABLE 2

Resistivity and optical transmission as a function of cross web position.

| Cross web position (inches) | Resistivity (ohms/square) | Transmission at 390 nm (%) | Transmission at 700 nm (%) |
|---|---|---|---|
| 8 | 6 | 66 | 64 |
| 9 | 9 | 70 | 77 |
| 10 | 16 | 71 | 81 |
| 11 | 40 | 70 | 74 |

Example 2

The electrochemical stability of coatings was examined by cyclic voltammetry using a Solartron 1287 potentiostat (available from Solartron Metrology, Gastonia, N.C.) located in a dry room with dew point less than −40° F. Samples were cycled three times at sweep rate of 20 mV/sec (starting and ending at open circuit voltage of approximately 3 V) between 1.5 and 4.2 V versus a lithium reference electrode in 0.5 M lithium bis(trifluoromethylsulfonimide) (LiTFSI, obtained from 3M Company) in anhydrous propylene carbonate (Sigma Aldrich). After cycling, samples were rinsed in dimethyl carbonate (Sigma Aldrich), allowed to dry in air, and examined by visible microscopy at 100-500× magnification under bright field and dark field illumination. The ITO/Ag/ITO coatings had sheet resistances of about 10 ohm/square. Using the method of Example 1 and a silver/gold sputtering target (15% Au), ITO/AgAu/ITO trilayer coatings were also fabricated, which had sheet resistances of 10-16 ohm/square. Susceptibility to corrosion was qualitatively evaluated under optical microscopy. The trilayer coatings containing gold all showed less corrosion than the trilayer coatings containing silver, with the amount of corrosion decreasing with increasing gold content. A clear stability advantage existed for the samples containing Au.

These results combined with the results of Example 1 above clearly show that a coating of AgAu or other Ag alloys with variable thickness sandwiched between ITO coatings can be fabricated with positional variations in AgAu thickness to produce resistivity gradients.

Example 3

Transparent conductor/metal/transparent conductor trilayers can be coated on a PET film substrate by sputtering. A layer of transparent conductor such as indium tin oxide (ITO), indium gallium zinc oxide, aluminum zinc oxide, zinc tin oxide, zinc gallium oxide, antimony tin oxide, or mixtures of similar oxides can be deposited using conditions similar to Example 2 in one pass with a shadow mask having a triangular cutout between the target and the web to create a thickness variation across the web. The web is then reversed and the metal layer of silver, silver-gold alloy with up to 20% gold, nickel, iron, copper or aluminum is deposited using conditions similar to Example 2. The metal is deposited in one pass through a shadow mask placed between the target and the web. The shadow mask has a triangular cutout to create a thickness variation across the web that will create a spatial change in resistance. The web is again reversed and a second transparent conductor of indium tin oxide, indium gallium zinc oxide, aluminum zinc oxide, zinc tin oxide, zinc gallium oxide, antimony tin oxide, or mixtures of similar oxides that may or may not be the same material as the first layer is deposited. The second transparent conducting layer is deposited in one pass through a shadow mask located between the target and the web and having a triangular cutout to create a thickness variation across the rolled polymer film substrate. The rolled polymer film substrate is often PET, but may be any of a number of polymer web rolls such as polyimide, polypropylene, polycarbonate, or other such films. For Table 3 that shows film thicknesses and modeled results of transmission, the ITO case is taken and shows a device with ITO/silver/ITO with variable top and bottom ITO. The top transparent conductor can be graded similarly or in reverse to the metal layer while the bottom layer can be graded opposite the metal thickness to provide a more substantial optical effect.

TABLE 3

Color and average transmission and reflection data for a top and bottom transparent conductor thickness variation.

| | Thickness | | | | | | |
|---|---|---|---|---|---|---|---|
| Expt # | Top ITO (nm) | Silver (nm) | Base ITO (nm) | Ref L* | Ref a* | Ref b* | 400-700% T | 400-700% R |
| 1 | 44 | 12 | 40 | 20.24219388 | 30.53349399 | −11.23020363 | 87.63200482 | 6.743512888 |
| 2 | 44 | 11 | 40 | 15.32137258 | 31.48116816 | −16.78566073 | 89.42361736 | 5.221838977 |

TABLE 3-continued

Color and average transmission and reflection data for a top and bottom transparent conductor thickness variation.

| | Thickness | | | | | | | |
|---|---|---|---|---|---|---|---|---|
| Expt # | Top ITO (nm) | Silver (nm) | Base ITO (nm) | Ref L* | Ref a* | Ref b* | 400-700% T | 400-700% R |
| 3 | 44 | 10 | 40 | 10.66278897 | 31.47746205 | -22.81560803 | 90.93715789 | 3.992381279 |
| 4 | 43 | 9 | 41 | 6.657131606 | 30.37206428 | -25.09200615 | 92.28758472 | 2.966547057 |
| 5 | 42 | 8 | 42 | 5.925251652 | 21.69934338 | -23.90422498 | 93.24187656 | 2.342152296 |
| 6 | 41 | 7 | 45 | 8.506302958 | 9.755866826 | -17.76122242 | 93.81312993 | 2.065494969 |
| 7 | 40 | 6 | 48 | 13.22913527 | 0.331621703 | -10.29190746 | 93.97385843 | 2.193889541 |
| 8 | 39 | 5 | 53 | 18.01312703 | -3.639227143 | -2.808478696 | 93.77568514 | 2.627255041 |
| 9 | 39 | 4 | 58 | 21.93489008 | -4.372353328 | 1.682247247 | 93.31120695 | 3.276768709 |
| 10 | 40 | 3 | 62 | 25.38236154 | -3.362528804 | 3.78490397 | 92.58542273 | 4.175234509 |
| 11 | 40 | 2 | 68 | 28.52975373 | -0.966169164 | 5.40379384 | 91.58812365 | 5.324900856 |
| 12 | 39 | 1 | 73 | 32.07157497 | 0.669109964 | 6.541106957 | 90.29638047 | 6.82384944 |

Table 4 shows a similar device to Table 3, but the ITO values are constant and only the silver layer is graded.

TABLE 4

Color and average transmission and reflection data for a top transparent conductor thickness variation.

| | Thickness | | | | | | | |
|---|---|---|---|---|---|---|---|---|
| Expt # | Top ITO (nm) | Silver (nm) | Base ITO (nm) | Ref L* | Ref a* | Ref b* | 400-700% T | 400-700% R |
| 1 | 44 | 12 | 40 | 20.24219388 | 30.53349399 | -11.23020363 | 87.63200482 | 6.743512888 |
| 2 | 44 | 11 | 40 | 15.32137258 | 31.48116816 | -16.78566073 | 89.42361736 | 5.221838977 |
| 3 | 44 | 10 | 40 | 10.66278897 | 31.47746205 | -22.81560803 | 90.93715789 | 3.992381279 |
| 4 | 44 | 9 | 40 | 7.279720463 | 28.12022915 | -27.77642299 | 92.13937429 | 3.087403946 |
| 5 | 44 | 8 | 40 | 6.834285017 | 18.30162751 | -28.90825555 | 93.00054244 | 2.535204153 |
| 6 | 44 | 7 | 40 | 9.59029596 | 5.904811234 | -25.72413914 | 93.49619326 | 2.358372904 |
| 7 | 44 | 6 | 40 | 14.1598528 | -2.623259129 | -20.46046266 | 93.60878506 | 2.572143356 |
| 8 | 44 | 5 | 40 | 19.23368593 | -6.361641581 | -15.150236 | 93.32912632 | 3.183026764 |
| 9 | 44 | 4 | 40 | 24.30452158 | -7.434083014 | -10.43643855 | 92.65734886 | 4.187935689 |
| 10 | 44 | 3 | 40 | 29.19811183 | -7.283314018 | -6.418044231 | 91.60326829 | 5.573951087 |
| 11 | 44 | 2 | 40 | 33.85774925 | -6.604424262 | -3.03415252 | 90.186046 | 7.318806776 |
| 12 | 44 | 1 | 40 | 38.26826343 | -5.720177383 | -0.192849523 | 88.43316946 | 9.392057845 |

Prophetic Example 1

A prophetic example is proposed that consists of a first transparent conductive oxide layer, a transparent metal layer on the first transparent conductive oxide layer, and a second transparent conductive oxide layer on the transparent metal layer and the bulk resistivity of first transparent conductive oxide layer is higher than the bulk resistivity of second transparent conductive oxide layer. This could be produced by coating ITO/Ag/ITO trilayers on a PET film substrate by sputtering. The PET (Melinex 505) is loaded into a roll to roll vacuum chamber and wound around a process drum. The process drum is maintained at a controlled temperature of 160° F. during deposition. The pressure in the vacuum chamber is reduced to $3\times10^{-5}$ Torr (0.004 Pa).

A layer of ITO can be deposited at 3 by introducing Argon with 2% hydrogen into the chamber at 85 sccm near the 90% indium oxide 10% tin oxide (by weight) source along with oxygen at 9 sccm for a total of 94 sccm, producing a pressure of about 0.003 Torr (0.799 Pa) and powered to 3 kW, 268 V and 11 A. The cathode is masked with a standard commercial aluminum sheet that is rolled to the diameter of the coating drum and has a triangular cutout to shadow part of the cathode on one side and leave it open on the other side to create variation in deposited material thickness across the sample. The web is then reversed and the Ag layer is deposited at 2 kW in a pressure of 3 mTorr argon at 5.5-6.5 fpm with a shadow mask between the target and the web. The web is again reversed and second ITO is deposited by changing the target material to one having 92.5% indium oxide and 7.5% tin oxide, and the mask is rotated 180 degrees to reverse the thickness gradient. The pressure in the vacuum chamber is again reduced to $3\times10^{-5}$ Torr (0.00399 Pa). Argon gas with 2% hydrogen at a flow rate of 85 sccm is introduced into the vacuum chamber through the ITO source along with oxygen at 6 sccm producing a pressure of about 0.0035 Torr (0.399 Pa) and is powered to 3 kW, 245 V and 12.46 A for a DC sputtered deposition of ITO powered by an Advanced Energy Pinnacle Plus power supply (Fort Collins, Colo.).

All references and publications cited herein are expressly incorporated herein by reference in their entirety into this disclosure. Illustrative embodiments of this invention are discussed and reference has been made to possible variations within the scope of this invention. For example, features depicted in connection with one illustrative embodiment may be used in connection with other embodiments of the invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below and equivalents thereof.

What is claimed is:

1. An article comprising:
a first transparent conductive oxide layer,
a transparent metal layer on the first transparent conductive oxide layer, wherein a thickness of the transparent metal layer continuously decreases in a direction; and
a second transparent conductive oxide layer on the transparent metal layer;
wherein a sheet resistance, $R_s$, to the flow of electrical current through the article, varies as a function of position in the article;
wherein a ratio of the value of maximum sheet resistance, $R_{max}$, to the value of minimum sheet resistance, $R_{min}$, in the article is at least 1.5, and
wherein the article is a conductor in an electrochromic device.

2. The article of claim 1, wherein the ratio of the value of maximum sheet resistance, $R_{max}$, to the value of minimum sheet resistance, $R_{min}$, in the transparent conducting layer is at least 5.

3. The article of claim 1, wherein the article is transparent to electromagnetic radiation having a wavelength from 300 to 5000 nm.

4. The article of claim 1, wherein the visible light transmission of the article is more than 40%.

5. The article of claim 1, wherein the visible light transmission of the article varies less than 10% in the direction or a direction perpendicular to the direction.

6. The article of claim 1, wherein the visible light transmission of the article varies less than 5% in the direction or a direction perpendicular to the direction.

7. The article of claim 1, wherein the reflectance of the article varies less than 4% in the direction or a direction perpendicular to the direction.

8. The article of claim 1, further comprising a substrate.

9. The article of claim 8, wherein the substrate is a glass substrate or a polymer substrate.

10. The article of claim 1, wherein the transparent metal layer comprises silver or silver alloy.

11. The article of claim 1, wherein the first and second transparent conductive oxide layers comprise indium tin oxide, tin oxide, zinc oxide, zinc aluminum oxide, zinc tin oxide, indium gallium zinc oxide, or combinations thereof.

12. The article of claim 1, wherein the transparent conductive coating is indium tin oxide.

13. A device comprising:
a first transparent substrate;
a first transparent conductive oxide layer,
a first transparent metal layer on the first transparent conductive oxide layer, wherein the thickness of the first transparent metal layer continuously decreases in a first direction; and
a second transparent conductive oxide layer on the transparent metal layer,
wherein the device is an electrochromic device.

14. The device of claim 13, further comprising
a third transparent conductive oxide layer, the second transparent conductive oxide layer being located between the first transparent metal layer and the third transparent conductive oxide layer;
a second transparent metal layer on the third transparent conductive oxide layer, wherein the thickness of the second transparent metal layer is graded in a direction opposite to the first direction; and
a fourth transparent conductive oxide layer on the second transparent metal layer.

15. The device of claim 14, the visible light transmission of the device varies less than 10% in the direction or a direction perpendicular to the direction.

16. An article comprising:
a first transparent conductive oxide layer, wherein the first transparent conductive oxide layer has a first bulk resistivity;
a transparent metal layer on the first transparent conductive oxide layer, wherein a thickness of the transparent metal layer continuously decreases in a direction; and
a second transparent conductive oxide layer on the transparent metal layer, wherein the second transparent conductive oxide layer has a second bulk resistivity;
wherein the first bulk resistivity is higher than the second bulk resistivity;
wherein a sheet resistance, $R_s$ of the article, varies as a function of position in the article;
wherein the ratio of the value of maximum sheet resistance, $R_{max}$, to the value of minimum sheet resistance, $R_{min}$, in the article is at least 1.5; and
wherein the article is a conductor in an electrochromic device.

17. The article of claim 16, wherein the first bulk resistivity is from 600 to 800 $\mu\Omega \cdot cm$.

18. The article of claim 16, wherein the second bulk resistivity is from 50 to 400 $\mu\Omega \cdot cm$.

19. The article of claim 16, wherein the visible light transmission of the article varies less than 10% in the first direction or a direction perpendicular to the first direction.

20. The article of claim 16, wherein the visible light transmission of the article varies less than 5% in the first direction or a direction perpendicular to the first direction.

* * * * *